United States Patent
Tian et al.

(10) Patent No.: US 8,216,886 B2
(45) Date of Patent: Jul. 10, 2012

(54) METHOD FOR MAKING SEMICONDUCTOR PACKAGE

(75) Inventors: Bin Tian, Tianjin (CN); Nan Xu, Tianjin (CN); Jinzhong Yao, Tianjin (CN)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/004,029

(22) Filed: Jan. 11, 2011

(65) Prior Publication Data

US 2011/0193237 A1     Aug. 11, 2011

(30) Foreign Application Priority Data

Feb. 11, 2010    (CN) .......................... 2010 1 0113690

(51) Int. Cl.
     *H01L 21/00*      (2006.01)
(52) U.S. Cl. ........ 438/124; 438/106; 438/126; 438/127; 257/E21.001; 257/E21.502
(58) Field of Classification Search .................. 438/124, 438/126, 127; 257/E21.001
See application file for complete search history.

(56) References Cited

U.S. PATENT DOCUMENTS

| | | | |
|---|---|---|---|
| 4,657,137 A * | 4/1987 | Johnson ........................ | 206/714 |
| 5,622,731 A | 4/1997 | Fierkens | |
| 5,830,403 A | 11/1998 | Fierkens | |
| 6,744,125 B2 | 6/2004 | Camenforte | |
| 6,927,485 B2 | 8/2005 | Lai | |
| 2009/0184403 A1 * | 7/2009 | Wang et al. .................... | 257/659 |

* cited by examiner

*Primary Examiner* — Angel Roman
(74) *Attorney, Agent, or Firm* — Charles Bergere

(57) ABSTRACT

A method for assembling a semiconductor package includes a rapid cooling step after post mold curing of an encapsulation material. The rapid cooling step includes blowing chilled, compressed air over the package for about two minutes. The rapid cooling step does not require any clamping pressure be simultaneously applied to the package. The rapid cooling step reduces a temperature of the encapsulation material from a curing temperature to the cooled temperature within a maximum period of less than five minutes. By using rapid cooling, as opposed to cooling the package under a clamping pressure with ambient air, package warpage due to CTE mismatches is prevented.

15 Claims, 5 Drawing Sheets

- PRIOR ART -

METHOD FOR MAKING SEMICONDUCTOR PACKAGE

BACKGROUND OF THE INVENTION

The present invention relates to a method for assembling a semiconductor package and a semiconductor package assembled by such a method. In particular, the present invention relates to curing and rapidly cooling an encapsulation material that encapsulates a semiconductor die that is a component of the package.

Typical semiconductor packages are formed with a semiconductor die mounted to either a lead frame or a removable support substrate (e.g., removable tape) supporting an arrangement of external connection pads and an optional flag. When a semiconductor package is formed from a semiconductor die mounted on a support substrate, the semiconductor package is usually referred to as a Flat No-lead package such as a Quad Flat No-lead (QFN) package or a Dual Flat No-lead (DFN) package.

The manufacture of Flat No-lead semiconductor packages includes encapsulating the semiconductor die and external connection pads with an encapsulation material. The encapsulation material is typically a molding compound that is cured and then gradually cooled from a curing temperature to room or ambient temperature. These two steps are called cure and post-mold cure. During post-mold cure, the package is maintained under pressure with a clamping device and gradually cooled using ambient air. However, it has been found that during such gradual cooling the semiconductor package can deform due to differences in coefficients of thermal expansion (CTE) of the semiconductor die and the substrate and the molding compound. More particularly, these CTE mismatches can cause an upper surface of the encapsulation material to become slightly domed (convex) and a corresponding base surface of the encapsulation material also to become slightly domed (concave). Unfortunately, the slightly domed upper surface is undesirable as the upper surface ideally should be flat so that a suction robot arm can pick up the package for post curing processing. Further, the slightly domed base surface can cause the external connection pads to be non-planar, resulting in poor quality solder connections of the external connection pads to mounting pads of a circuit board. Thus, it would be advantageous to be able to assemble a semiconductor package that is not warped during post-mold curing.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
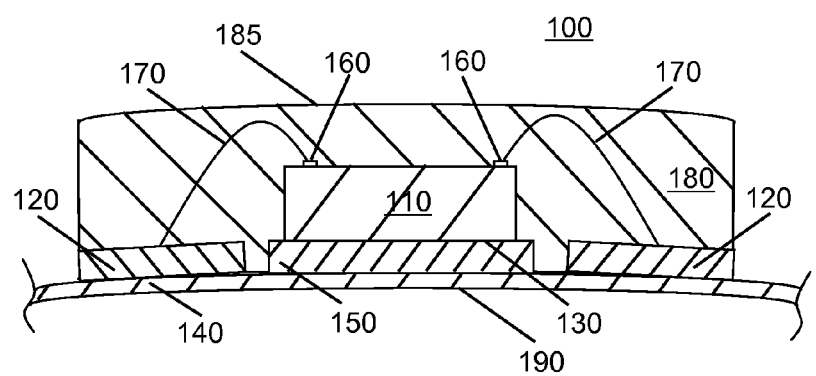
FIG. 1 is a cross-sectional side view of a conventional Flat No-lead semiconductor package.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that system, circuit, device components and method steps that comprises a list of elements or steps does not include only those elements but may include other elements or steps not expressly listed or inherent to such system, circuit, device components or steps. An element or step proceeded by "comprises . . . a" does not, without more constraints, preclude the existence of additional identical elements or steps that comprises the element or step.

In one embodiment the present invention provides a method for manufacturing a Flat No-lead semiconductor package. The method includes mounting a base surface of a semiconductor die to a support substrate and then electrically connecting die electrical connection pads, on an upper surface of the die, to respective external connection pads that are mounted to the support substrate. Next, the method performs encapsulating the semiconductor die and external connection pads with an encapsulation material to form the semiconductor package. The encapsulation material, and support substrate, sandwich the external connection pads and at a curing step there is performed curing of the encapsulation material at a curing temperature. Next, at a cooling step, the encapsulation material is rapidly cooled from the curing temperature to a cooled temperature of less than fifty degrees centigrade. The cooling is assisted by a fluid flow directed over the encapsulation material. The rapid cooling reduces a temperature of the encapsulation material from curing temperature to the cooled temperature within a maximum period of less than five minutes.

Referring to FIG. 1 there is illustrated a cross sectional side view of a prior art Flat No-lead semiconductor package 100. The Flat No-lead semiconductor package 100 has a semiconductor die 110 and external connection pads 120 that are both mounted to a support substrate 140. A base surface 130, of the semiconductor die 110, is typically mounted to the support substrate 140 via a flag 150. Also, die electrical connection pads 160 on an upper surface of the semiconductor die 110 are electrically connected, by bonded wires 170, to their respective external connection pads 120. An encapsulation material 180 encapsulates the semiconductor die 110 and external connection pads 120 so that the encapsulation material 180 and support substrate 140 sandwich the external connection pads 120. The encapsulation material 180 is typically a molding compound that is cured at around one hundred and seventy five degrees centigrade and then gradually cooled to room or ambient temperature. The support substrate 140 is generally a flexible single sided sticky tape and after curing, and gradually cooling the encapsulation material 180 to room temperature, the semiconductor package 100 can slightly deform. Deformation of the semiconductor package 100 is due to differences in the coefficient expansion of the semiconductor die 110 and the encapsulation material 180. This deformation may cause an upper surface 185 of the encapsulation material 180 to be slightly domed (convex) and a corresponding base surface 190 of the encapsulation material 180 to also be slightly domed (concave). As previously mentioned, the slightly domed upper surface 185 is undesirable as the upper surface should be ideally flat so that a suction robot arm can pick up the package for post curing processing. In addition, the slightly domed base surface 190 can cause the external connection pads 120 to be non-planar thereby resulting in poor quality solder connection of the external connection pads 120 to mounting pads of a circuit board.

Figure 2:
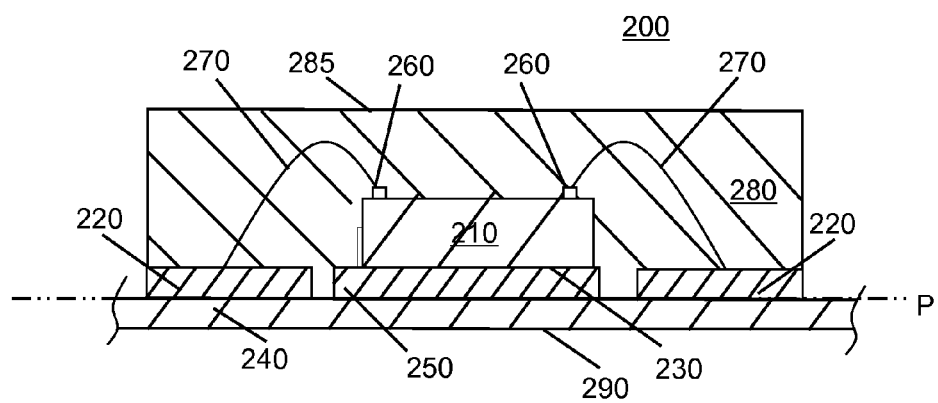
FIG. 2 is a cross-sectional side view of a Flat No-lead semiconductor package in accordance with an embodiment of the present invention.

Referring to FIG. 2 there is illustrated a cross sectional side view of a Flat No-lead semiconductor package 200 in accordance with a preferred embodiment of the present invention. The Flat No-lead semiconductor package 200 has a semiconductor die 210 and external connection pads 220 that are both mounted to a support substrate 240 which is typically a removable tape such as a flexible single sided sticky tape. A base surface 230 of the semiconductor die 210 is mounted to the support substrate 240 via a flag 250. Also, die electrical connection pads 260 on an upper surface of the semiconductor die 210 are electrically connected, by bonded wires 270, to their respective external connection pads 220. An encapsulation material 280 encapsulates the semiconductor die 210 and external connection pads 220 so that the encapsulation material 280 and support substrate 240 sandwich the external connection pads 220. The encapsulation material 280 is typically a molding compound that is cured at around one hundred and seventy five degrees centigrade and then rapidly cooled to room or ambient temperature in accordance with a method in accordance with the present invention described hereinafter. As shown, an upper surface 285 of the encapsulation material 280 is substantially flat so that a suction robot arm can pick up the package for post curing processing. In addition a base surface 290 can is substantially planar in a plane P thereby providing a mounting plane for solder connection of the external connection pads 220 to mounting pads of a circuit board.

Figure 3:
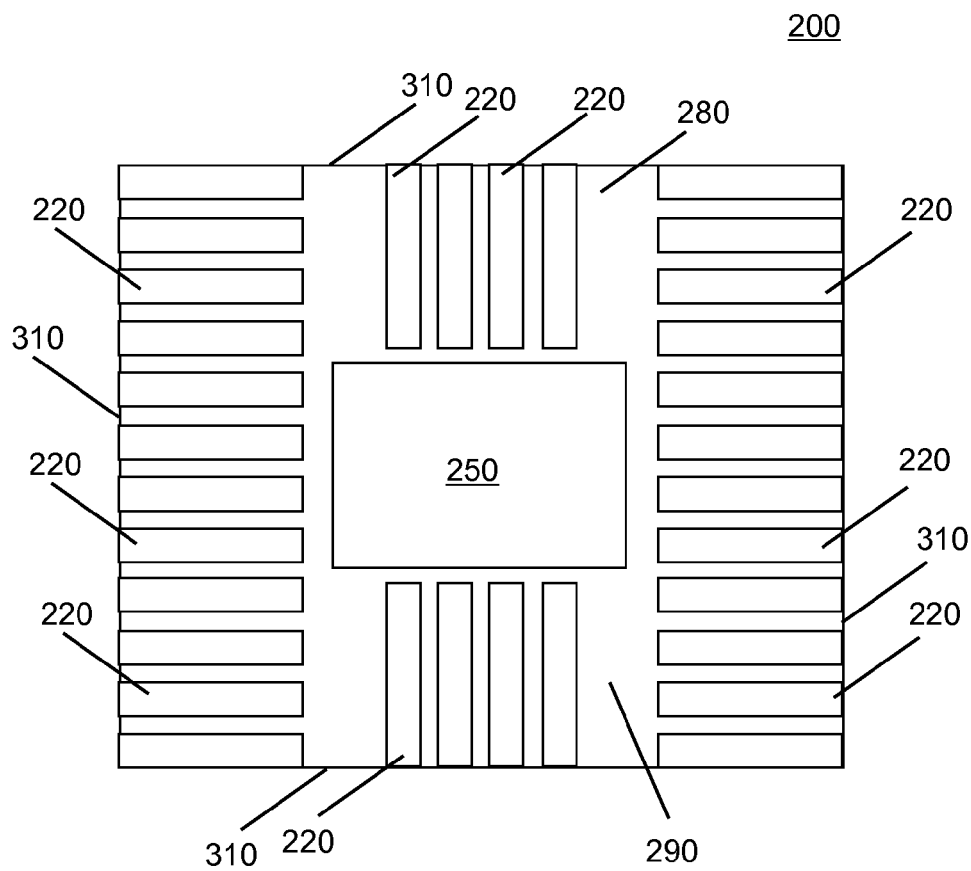
FIG. 3 is an underside view of the Flat No-lead semiconductor package of FIG. 2 with a support substrate removed.

In FIG. 3 there is illustrated an underside view of the Flat No-lead semiconductor package 200 with the support substrate 240 is removed. As illustrated, the external connection pads 220 are associated with all four edges 310 of the encapsulation material 280 and therefore the Flat No-lead semiconductor package 200 is a Quad Flat No-lead semiconductor package. However, it will be apparent to a person skilled in the art that the external connection pads 220 may not be associated with every one of the edges 310.

Figure 4:
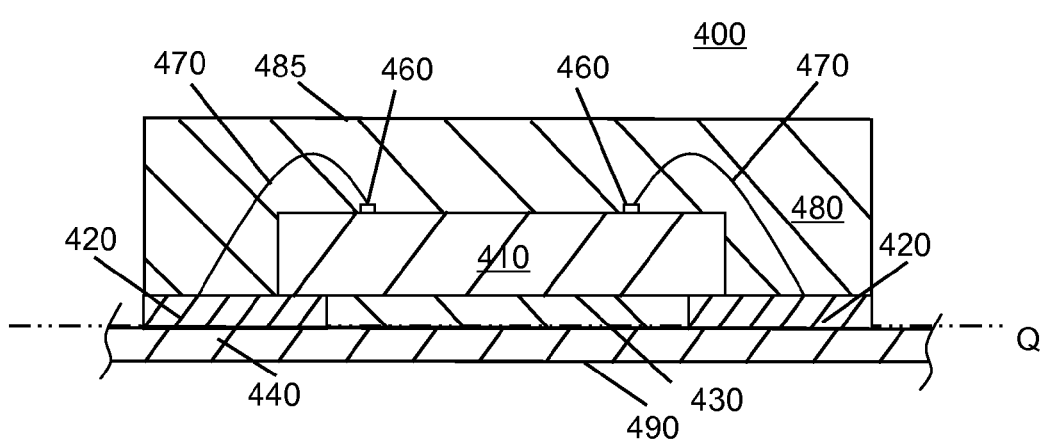
FIG. 4 is a cross-sectional side view of a Flat No-lead semiconductor package in accordance with another embodiment of the present invention.

Referring to FIG. 4 there is illustrated a cross sectional side view of a Flat No-lead semiconductor package 400 in accordance with another preferred embodiment of the present invention. The Flat No-lead semiconductor package 400 has a semiconductor die 410 and external connection pads 420 that are both mounted to a support substrate 440 which is typically a removable tape such as a flexible single sided sticky tape. A base surface 430 of the semiconductor die 410 is mounted to the support substrate 440 via at least some of the external electrical connection pads 420. There are die connection pads 460 on an upper surface of the semiconductor die 410 are electrically connected, by bonded wires 470, to their respective external connection pads 420. An encapsulation material 480 encapsulates the semiconductor die 410 and external connection pads 420 so that the encapsulation material 480 and support substrate 440 sandwich the external connection pads 420. Again, the encapsulation material 480 is typically a molding compound that is cured at around one hundred and seventy five degrees centigrade and then rapidly cooled to room or ambient temperature in accordance with a method in accordance with the present invention described below. As shown, an upper surface 485 of the encapsulation material 480 is substantially flat so that a suction robot arm can pick up the package for post curing processing. In addition a base surface 490 can is substantially planar in a plane Q thereby providing a mounting plane for solder connection of the external connection pads 420 to mounting pads of a circuit board.

Figure 5:
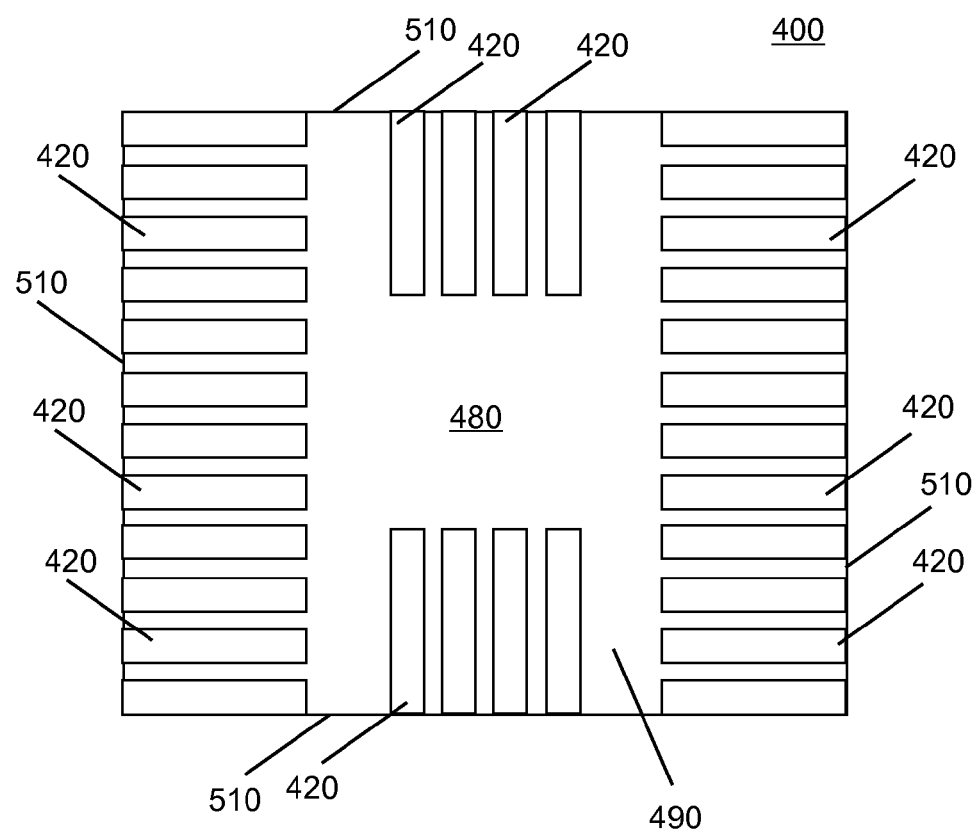
FIG. 5 is an underside view of the Flat No-lead semiconductor package of FIG. 4 with a support substrate removed.

In FIG. 5 there is illustrated an underside view of the Flat No-lead semiconductor package 400 with the support substrate 440 is removed. As illustrated, the external connection pads 420 are associated with all four edges 510 of the encapsulation material 480 and therefore the Flat No-lead semiconductor package 400 is a Quad Flat No-lead semiconductor package. Again, it will be apparent to a person skilled in the art that the external connection pads 220 may not be associated with every one of the edges 310.

Figure 6:
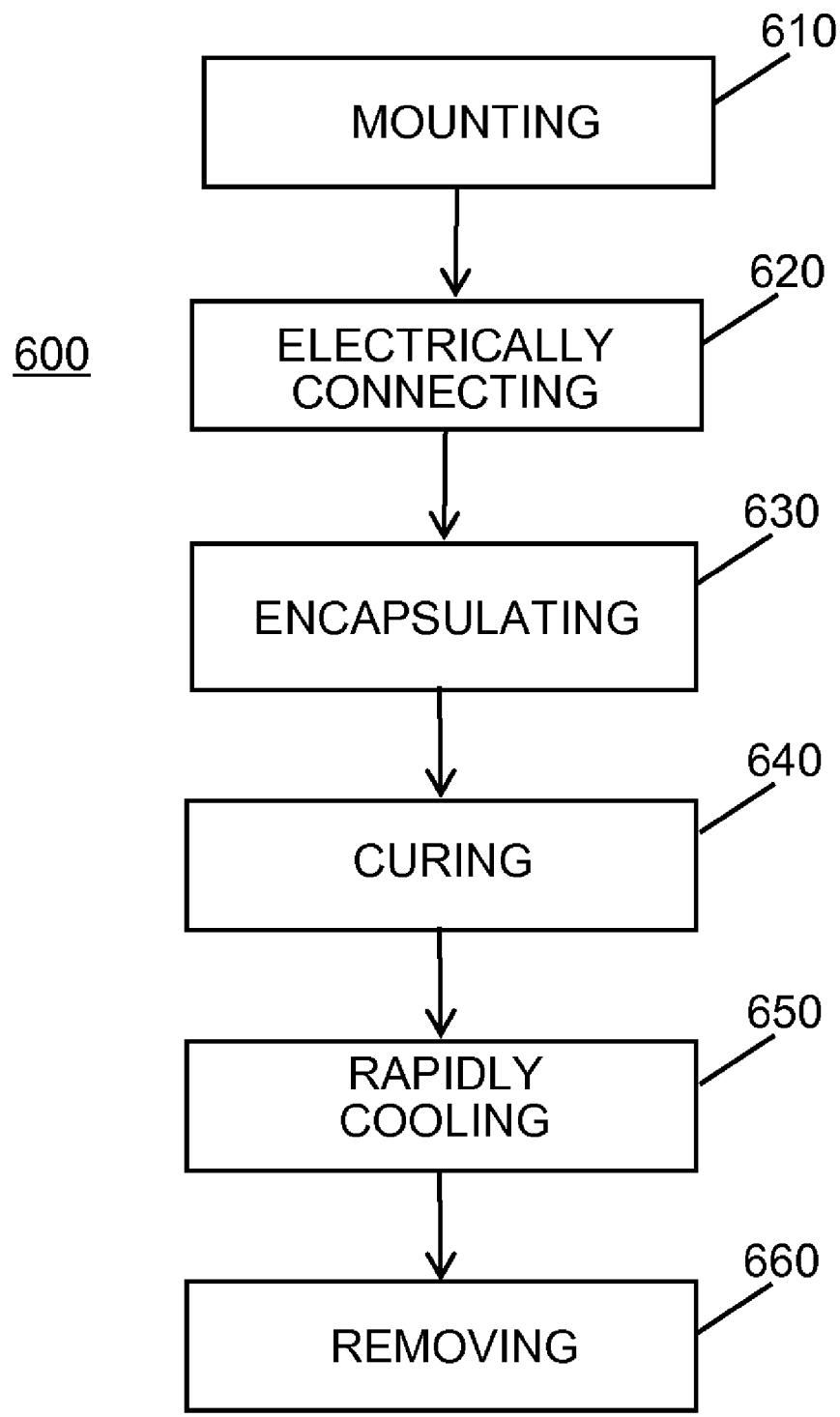
FIG. 6 illustrates a method for manufacturing the Flat No-lead semiconductor package of FIG. 2 or FIG. 4 in accordance with an embodiment of the present invention.

With reference to FIG. 6 there is illustrated a method 600 for manufacturing the Flat No-lead semiconductor package of 200 or 400 according to a preferred embodiment of the present invention. The method 600, at a mounting step 610, performs mounting the base surface 230, 430 of the semiconductor die 210, 410 to the support substrate 240, 440. At an electrically connecting step 620 there is performed electrically connecting the die electrical connection pads 260, 460, on an upper surface of the semiconductor die 210, 410 to their respective external connection pads 220, 420. There is then performed, at an encapsulating step 630, encapsulating the semiconductor die 210, 410 and the external connection pads 220, 420 with the encapsulation material 280, 480 to form the semiconductor package 200, 400. More specifically, the encapsulation material 280, 480 and support substrate 240, 440 sandwich the external connection pads 220, 420. Next, at a curing step 640, the method 600 performs curing the encapsulation material 280, 480 at a curing temperature TC. This curing temperature TC is usually one hundred and seventy five degrees centigrade plus or minus ten percent and the curing is generally performed for five hours plus or minus ten percent.

After curing the method 600 performs, at a cooling step 650, cooling the encapsulation material from the curing temperature TC to a cooled temperature TCD of no more than fifty degrees centigrade and ideally less than thirty degrees centigrade. The cooling is characterized by being at least partially assisted by a fluid flow directed over the encapsulation material 280, 480 to thereby reduce a temperature of the encapsulation material 280, 480 from curing temperature TC to the cooled temperature TCD within a maximum period of less than five minutes and suitably within (less than) three minutes. More specifically, the fluid flow is an air flow that has a rate of flow of at least 1 meter per second provided by one or more fans. In one embodiment, the air flow is at ambient temperature or in one alternative the wherein the air flow is cooled to an air flow temperature below ten degrees centigrade.

After the cooling, at a removing step 660, there is performed removing (singulating) the support substrate 240, 440 from the semiconductor package 200, 400. The removing is effected by peeling the support substrate 240, 440 (removable tape) from the semiconductor package 200, 400 thereby leaving a surface of the external connection pads exposed for mounting to mounting pads of a circuit board.

Advantageously, the cooling step 650 of the present invention alleviates or at least reduces the effects of deformation of the semiconductor package 200,400 is due to differences in the coefficient expansion of the semiconductor die 210, 410 and the encapsulation material 280, 480. Accordingly, as mentioned above, the present invention provides for an upper surface 285, 485 of the encapsulation material 280, 480 to be substantially flat so that a suction robot arm can pick up the package for post curing processing. In addition a base surface 290 can is substantially planar thereby providing a mounting plane for solder connection of the external connection pads 220 or 420 to mounting pads of a circuit board.

Figure 7:
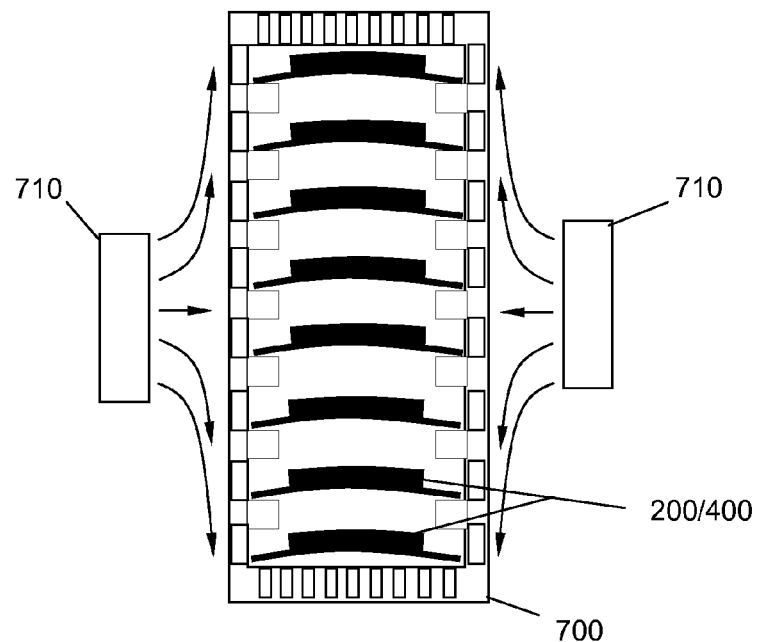
FIG. 7 illustrates a method of effecting a post-mold curing step in accordance with one embodiment of the present invention.

Referring now to FIG. 7, a method for effecting rapid post-mold curing in accordance with one embodiment of the present invention is illustrated. FIG. 7 shows a magazine rack type holder 700 that has a plurality of slots for holding the Flat No-lead semiconductor packages 200 or 400. Blowers 710 are located proximate to the holder 700 for blowing a fluid across the Flat No-lead semiconductor packages 200/400 to achieve rapid cooling of the packages 200/400. As discussed above, in one embodiment, the blowers 710 blow compressed, chilled air over the packages 200/400 such that the packages 200/400 are cooled from a post-mold cure temperature of about 175° C. to about 25° C. in five minutes or less.

Figure 8:
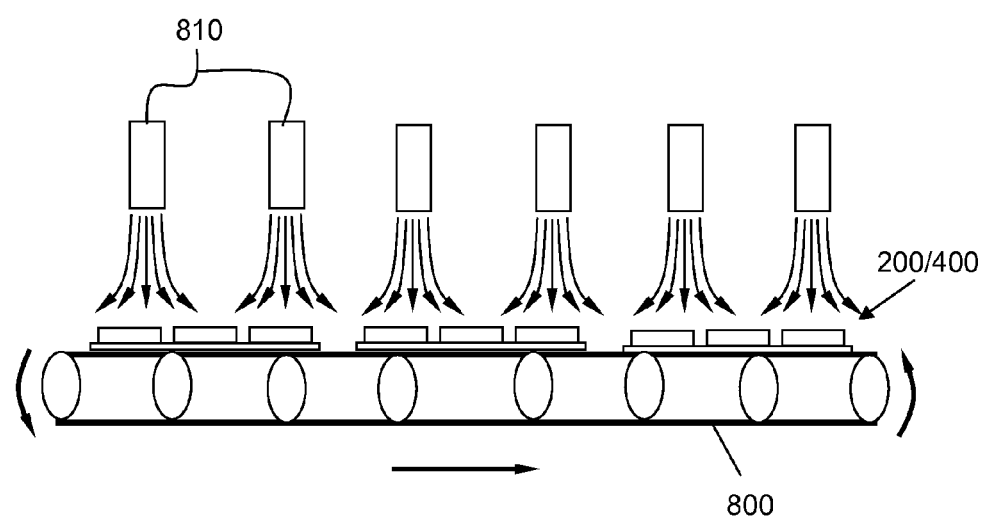
FIG. 8 illustrates a method of effecting a post-mold curing step in accordance with another embodiment of the present invention.

FIG. 8 illustrates a method for effecting rapid post-mold curing in accordance with another embodiment of the present invention. FIG. 8 shows a transmission strip or rail 800 upon which a plurality of the Flat No-lead semiconductor packages 200 or 400 are mounted. The rail 800 moves the packages 200/400 beneath one or more blowers or fans 810 in the direction of the arrows. The blowers 810 blow a fluid across the Flat No-lead semiconductor packages 200/400 to achieve rapid cooling of the packages 200/400. Again, as discussed above, the blowers 810 may blow compressed, chilled air over the packages 200/400 such that the packages 200/400 are cooled from a post-mold cure temperature of about 175° C. to about 25° C. in five minutes or less.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method for assembling a Flat No-lead semiconductor package, comprising:
   mounting a base surface of a semiconductor die to a support substrate;
   electrically connecting die electrical connection pads on an upper surface of the die to respective external connection pads that are mounted to the support substrate;
   encapsulating the semiconductor die and external connection pads with an encapsulation material to form the semiconductor package, wherein the encapsulation material and support substrate sandwich the external connection pads therebetween;
   curing the encapsulation material at a curing temperature; and
   rapidly cooling the encapsulation material from the curing temperature to a cooled temperature of no more than fifty degrees centigrade, the rapid cooling being at least partially assisted by a fluid flow directed over the encapsulation material to thereby reduce a temperature of the encapsulation material from a curing temperature to the cooled temperature within a maximum cooling period of less than five minutes.

2. The method of claim 1, wherein the fluid flow is an air flow.

3. The method of claim 2, wherein the air flow has a rate of flow of at least 1 meter per second.

4. The method of claim 2, wherein the air flow is provided by at least one fan.

5. The method of claim 2, wherein a temperature of the air directed over the encapsulation material is at ambient temperature.

6. The method of claim 2, wherein a temperature of the air directed over the encapsulation material is twenty-five degrees centigrade or less.

7. The method of claim 1, wherein the maximum cooling period is less than three minutes.

8. The method of claim 1, wherein the curing temperature is one hundred and seventy five degrees centigrade plus or minus ten percent.

9. The method of claim 8, wherein the curing is performed for five hours plus or minus ten percent.

10. A method for assembling a semiconductor package, comprising:
    mounting a semiconductor die to a support substrate;
    electrically connecting the die to the support substrate;
    encapsulating the semiconductor die and at least a portion of the top surface of the support substrate with an encapsulation material to form the semiconductor package;
    curing the encapsulation material at a curing temperature; and
    rapidly cooling the encapsulation material from the curing temperature to a cooled temperature of no more than fifty degrees centigrade, the rapid cooling being at least partially assisted by a fluid flow directed over the encapsulation material to thereby reduce a temperature of the encapsulation material from a curing temperature to the cooled temperature within a maximum cooling period of less than five minutes.

11. The method of claim 10, wherein the fluid flow is an air flow having a flow rate of at least 1 meter per second.

12. The method of claim 11, wherein a temperature of the air directed over the encapsulation material is twenty-five degrees centigrade or less.

13. The method of claim 10, wherein the maximum cooling period is less than three minutes.

14. The method of claim 10, wherein the curing temperature is one hundred and seventy five degrees centigrade plus or minus ten percent.

15. The method of claim 14, wherein the curing is performed for five hours plus or minus ten percent.

* * * * *